(12) United States Patent
Fan et al.

(10) Patent No.: US 12,022,629 B2
(45) Date of Patent: Jun. 25, 2024

(54) SMART CLOTHING AND ITS DEVICE MOUNT

(71) Applicant: AMPAK Technology Inc., HsinChu (TW)

(72) Inventors: Wen-Sung Fan, HsinChu (TW); Kai-Yuan Cheng, HsinChu (TW); Chih-Wei Tu, HsinChu (TW); Pei-Wen Liao, HsinChu (TW); Ming-Hui Yao, HsinChu (TW); Tzong-Yow Ho, HsinChu (TW)

(73) Assignee: AMPAK TECHNOLOGY INC., Hsinchu (TW)

( * ) Notice: Subject to any disclaimer, the term of this patent is extended or adjusted under 35 U.S.C. 154(b) by 300 days.

(21) Appl. No.: 17/749,515

(22) Filed: May 20, 2022

(65) Prior Publication Data
US 2023/0284403 A1 Sep. 7, 2023

(30) Foreign Application Priority Data

Mar. 3, 2022 (TW) .................................. 111107637

(51) Int. Cl.
*H05K 5/02* (2006.01)
*A41D 1/00* (2018.01)
*H05K 1/02* (2006.01)
*H05K 7/14* (2006.01)

(52) U.S. Cl.
CPC ........... *H05K 5/0217* (2013.01); *A41D 1/005* (2013.01); *H05K 1/0277* (2013.01); *H05K 7/1427* (2013.01)

(58) Field of Classification Search
CPC .. H05K 5/0217; H05K 1/0277; H05K 7/1427; A41D 1/005
USPC .......................................................... 361/749
See application file for complete search history.

(56) References Cited

U.S. PATENT DOCUMENTS

2016/0116148 A1* 4/2016 Chang ....................... F21K 9/20
362/267

* cited by examiner

*Primary Examiner* — Binh B Tran
(74) *Attorney, Agent, or Firm* — Chun-Ming Shih; LANWAY IPR SERVICES

(57) ABSTRACT

The present invention discloses a smart clothing and its device mount, wherein the device mount includes an upper casing and a lower casing, a circuit board is arranged between the upper casing and the lower casing, and a metal contact of the top surface of the circuit board penetrates through the upper casing to form a plurality of metal contact points, and the cable interface of the bottom surface of the circuit board passes through the lower casing, and the bottom surface of the lower casing is formed with individual cable grooves toward each cable interface for guiding the transmission wire to insert into the cable interface along the cable groove, and the device mount is combined with a soft gasket on the clothing body and is equipped with a waterproof protective layer to avoid damage to the circuit components and transmission wire during cleaning; when the device mount is installed with the electronic device, the motion status can be monitored.

20 Claims, 14 Drawing Sheets

SMART CLOTHING AND ITS DEVICE MOUNT

CROSSED-REFERENCE TO RELATED APPLICATION

This application claims priority to and the benefit of Taiwan Patent Application No. 111107637, filed on Mar. 3, 2022, in the Taiwan Patent and Trademark Office, the entire content of which is incorporated herein by reference.

FIELD OF THE INVENTION

The present invention relates to smart clothing and its device mount. The device mount is a base that can be loaded with an electronic device for sensing or computing, which is arranged on the smart clothing, and the electronic device can be assembled on the device mount during exercise so the motion state can be monitored.

BACKGROUND OF THE INVENTION

In modern life, people are busy and stressed. This environment lead to physical and mental health issues. Exercise and fitness have become important methods to manage stress these days.

In order to exercise effectively, lots of professional athletes utilize electronic tracker to record personal physiological metrics during exercise. The data captured enabled analytical and scientific training method for the users to improve the exercise effectiveness towards their goal, and further understand their own physical conditions.

In recent years, many manufacturers have developed products that combine sensors on clothing. Some products are designed to suspend the wires directly outside the clothing. However, this is not only inconvenient for users to wear, but also interferes with the exercise and makes the user discomfort. Some products utilize rivet buttons to attach the sensors to the fabric with cable routing. This approach is difficult for mass-production. Partial damage caused by pulling of the clothes will scrap the product, which is not environmental friendly.

In addition, frequent cleaning is required for sports wearables. If the sensors are fixed on the clothing, waterproof treatment on sensors and cabling does not provide sufficient durability for household cleaning methodology to prevent the sensors from damage. The price of smart clothing cannot be reduced due to the high cost of sensors. If the product life span is too short and the cost is too expensive, the product will not be affordable to the majority of consumer. Therefore, a more environmentally friendly and economical design is urgently needed to make smart clothing meet the consumers' needs.

SUMMARY OF THE INVENTION

The present invention provides a device mount, which is used for electrical connection with an electronic device with a plurality of metal external contacts on a lower surface, wherein the device mount includes: an upper casing provided with a plurality of first through-holes on the surface, and the edge of the upper casing extending upward to form at least one positioning sidewall, and at least one first positioning structure being formed around the positioning sidewall, and the electronic device being fixed in the range surrounded by the positioning sidewall through the first positioning structure, and the position of the first through-hole corresponding to the position of the metal external contact of the electronic device, and a concave positioning part is provided at the periphery of the bottom surface of the upper casing; a circuit board provided with a plurality of metal contacts, the top surface of the circuit board being attached under the upper casing, and the metal contacts penetrating the first through-holes to form a plurality of metal contact points, and the metal contact points being used for contacting with the metal external contacts, and the bottom surface of the circuit board being provided with a plurality of cable interfaces; and a lower casing, at least one first convex positioning part being arranged at the periphery of a top surface of the lower casing, and the first convex positioning part being positioned in the concave positioning part so that the lower casing and the upper casing are connected, and the circuit board being wrapped between the upper casing and the lower casing, and a plurality of second through-holes being opened on the surface of the lower casing corresponding to the position of the cable interface, which is made for the cable interface of the circuit board to pass through the second through-hole, and a bottom surface of the lower casing being concaved from the edge to the second through-hole to form a first cable groove which is used to inserting an adapter at either end of a transmission wire into the cable interface in the second through-hole along the first cable groove.

More specifically, the electronic device is a sensing device, a stimulation device, a processing device, or a combination thereof.

More specifically, the transmission wire is a telescopic elastic belt body, and a plurality of metal wires are arranged in a wave or zigzag shape inside the telescopic elastic belt body, wherein the metal wires are connected to the adapter.

More specifically, the adapter at one end of the transmission wire is connected to the cable interface, and the adapter at the other end of the transmission wire is connected to a cable interface of another device mount, a cable interface of a battery device, or a cable interface of an electrode patch.

More specifically, a soft gasket extends outward from the periphery of the upper casing or the lower casing, and a bottom surface of the soft gasket is concaved toward the first cable groove to form a second cable groove, and the inclination of the second cable groove is the same as the inclination of the first cable groove so that the second cable groove and the first cable groove extend out a continuously extending plane. In one of the embodiments, the soft gasket includes a second convex positioning part and an assembly hole is formed, the second convex positioning part and the first convex positioning part are combined in the concave positioning part, and the lower casing is tightly sealed in the assembly hole so that the periphery of the lower casing extends outwardly of the soft gasket. In another embodiment, the soft gasket is arranged and extended around the periphery of the upper casing.

The present invention provides a smart clothing using a device mount, comprising: at least one above mentioned device mount; a clothing body having a surface fabric layer, at least one opening hole being dug on the surface fabric layer, and the device mount passing through the opening hole, and the soft gasket being attached to an inner side of the surface fabric layer so that the upper casing is exposed to an outer side of the surface fabric layer, and the cable interface of the circuit board facing the inner side of the surface fabric layer; and at least one transmission wire, an adapter at either end of the transmission wire being inserted into the cable interface in the second through-hole along the second cable groove and the first cable groove, and the transmission wire extending along the inner surface of the surface fabric layer in any direction, and the inner surface of the surface fabric layer being combined with a waterproof protective layer to cover the bottom surface of the lower casing and the extension range of the transmission wire.

More specifically, the smart clothing of the present invention further comprises an electronic device, and the electronic device is a sensing device, a stimulation device, a processing device, or a combination thereof.

More specifically, the transmission wire of the present invention is a telescopic elastic belt body, and a plurality of metal wires arranged in wave or zigzag shape inside the telescopic elastic belt body, wherein the metal wires are connected to the adapter.

More specifically, the smart clothing of the present invention further comprises at least one battery device with a cable interface or/and at least one electrode patch with a cable interface, and the transmission wire being extended from the inner surface of the surface fabric layer and connected to the cable interface of another device mount, the cable interface of the battery device or the cable interface of the electrode patch.

More specifically, a waterproof surface layer of the present invention is further laid on an upper surface of the transmission wire, and the waterproof protective layer is attached to the inner surface of the surface fabric layer by bonding or sewing.

More specifically, a waterproof surface layer of the present invention is further laid on the inner surface of the surface fabric layer, and the waterproof surface layer is pasted on and corresponding to the waterproof protective layer to wrap the transmission wire.

Therefore, the present invention provides a device mount for placing an electronic device with a sensing function, stimulation function, or computing function, and the base is combined with the clothing. Even more, through the special structure of waterproof design and the transmission wire, the device mount of the smart clothing is electrically connected in series. Therefore, when the user wants to exercise, he/she only needs to place the electronic device on the device mount, and the signal can be transmitted to the electronic device on other bases for monitoring and calculation of the motion state. Also, during the cleaning, the electronic device can be removed for cleaning to avoid damage or destruction of the expensive electronic device. The base and transmission wires have been waterproofed, so they can withstand a certain number of cleanings. Even if it is damaged during cleaning, users can buy a replacement for use as consumables because of the low cost. Thus, the present invention should be an optimal solution for users.

BRIEF DESCRIPTION OF THE DRAWINGS

FIG. 3C is the schematic diagram of the combined cross-section structure of the device mount in embodiment 2 of the present invention.

FIG. 3D is the schematic diagram of the combined three-dimensional structure of the device mount in embodiment 2 of the present invention.

DETAILED DESCRIPTION OF THE INVENTION

Figure 1A:
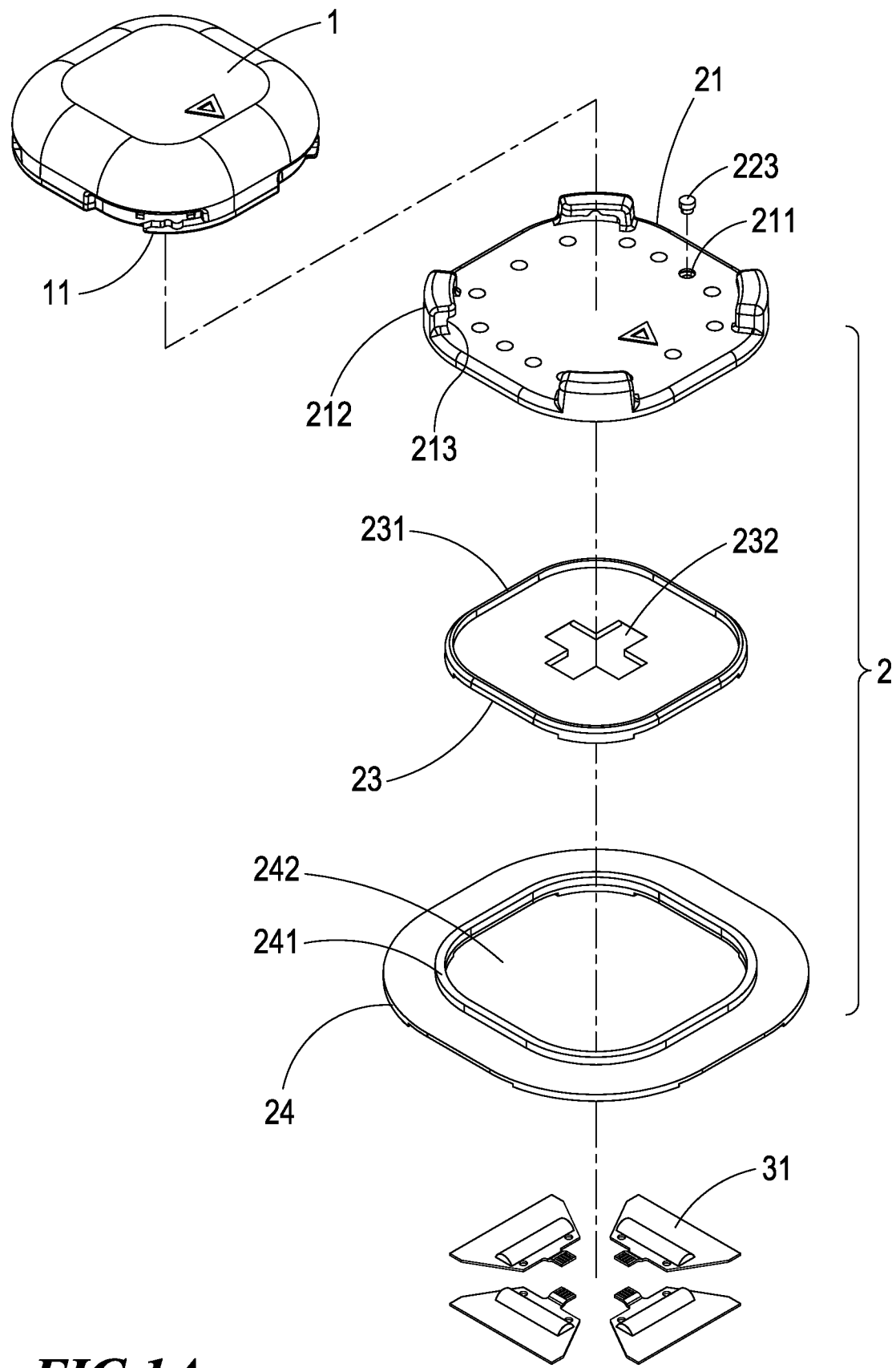
FIG. 1A is the oblique top view of the exploded structure of the device mount in embodiment 1 of the present invention.
Figure 1B:
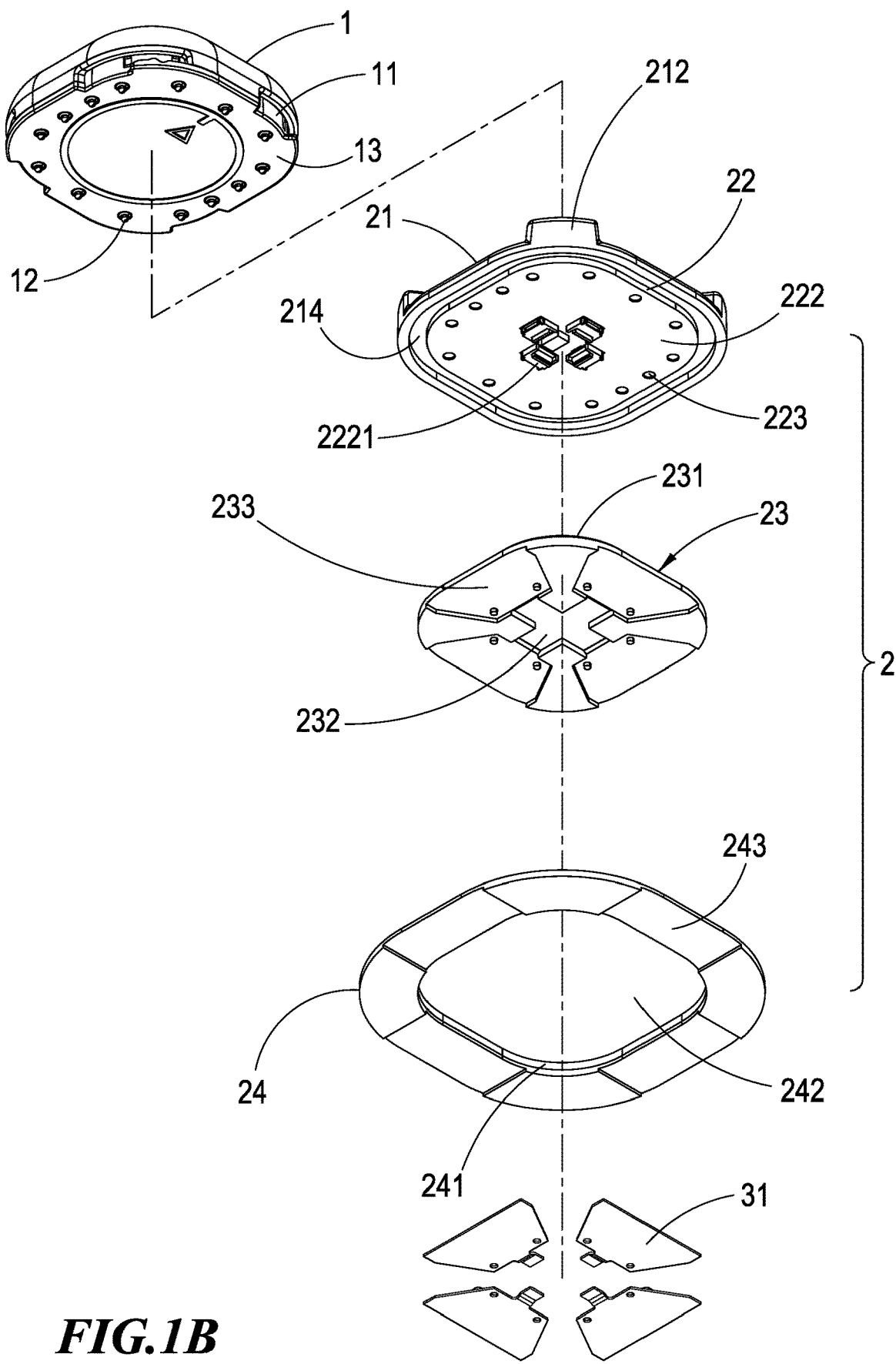
FIG. 1B is the oblique bottom view of the exploded structure of the device mount in embodiment 1 of the present invention.
Figure 1C:
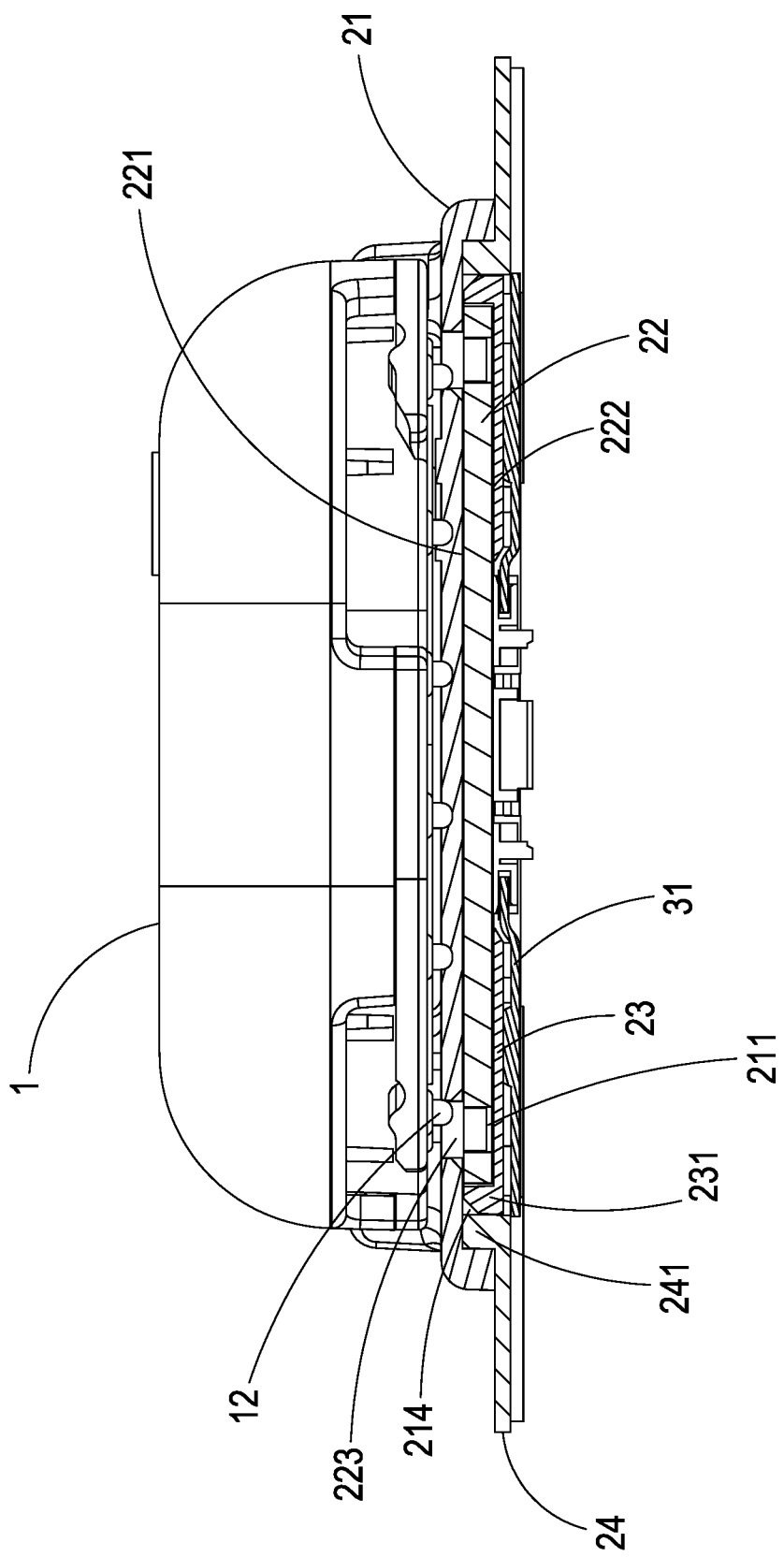
FIG. 1C is the schematic diagram of the combined cross-section structure of the device mount in embodiment 1 of the present invention.
Figure 1D:
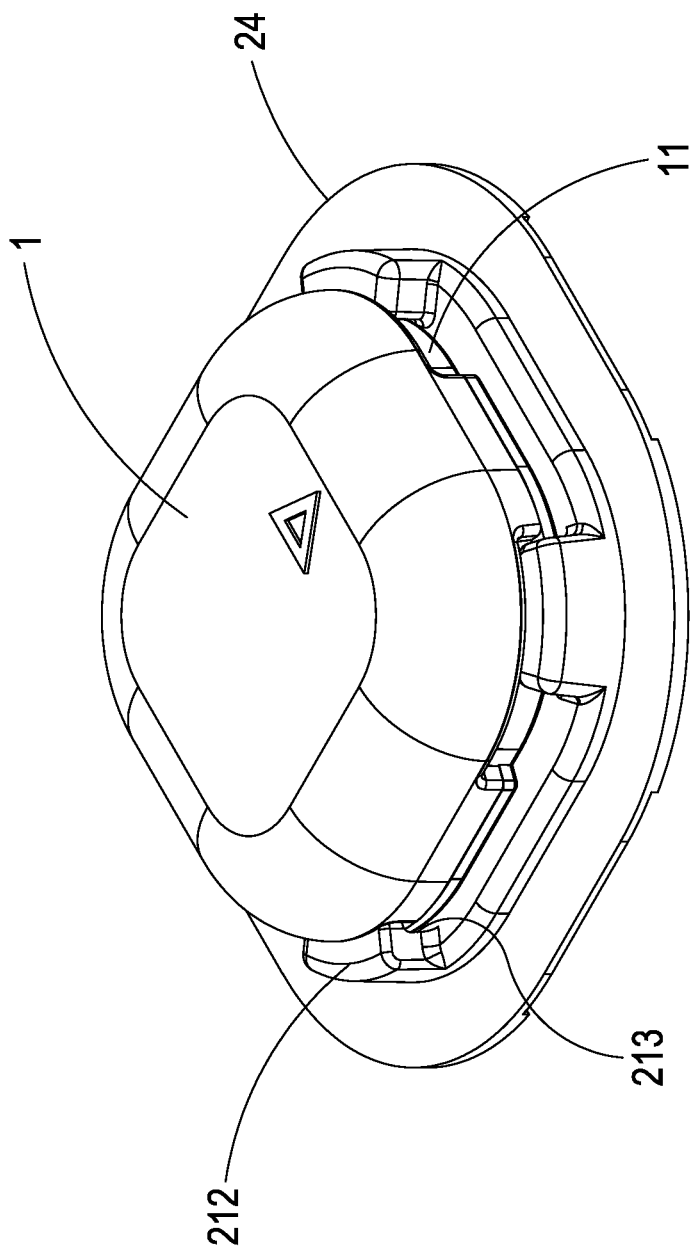
FIG. 1D is the schematic diagram of the combined three-dimensional structure of the device mount in embodiment 1 of the present invention.

Other technical contents, features, and effects of the present invention will be clearly presented in the following description of the preferred embodiments with reference to the drawings.

As used herein, the articles "a," "an," and "any" refer to the grammar of one or more than one (i.e., at least one) item. For example, "an element" means one element or more than one element.

As used herein, the term "arrangement" used for describing the structure combination relationship generally refers to the fact that multiple structures will not be easily separated or dropped after being combined. It can be a fixed connection, a detachable connection, an integral connection, a mechanical connection, an electrical connection, a direct physical connection, or an indirect connection through intermediate media, such as the use of threads, tenon, fasteners, nails, adhesives, high frequency or any combination thereof. As used herein, "opening", "open" generally refer to forming an opening hole at a certain location by means of drilling, integral molding, molding, 3D printing, etc.

As used herein, the terms "convex," "concave," "pierced," "formed," or "extended" used for describing the structure combination relationship generally refer to one structure or more structures combined into the same body during manufacture, or corresponding structures on the same body due to different positions, shapes, and functions.

As used herein, the terms "inner side" and "inside" for describing a structure position refer to a position being close the center of the structure body or a position that is not exposed in use; the term "inward" refers to facing toward the center of the structure body, or toward a position that is not exposed in use; the terms "outer side" and "outside" for describing a structure position refer to a position being away from the center of the structure body or a position that is exposed in use; the term "outward" refers to facing away from the center of the structure body, or toward a position that is exposed in use.

As used herein, the term "on" for describing the location of a structure refers to any surface location of the structure, not commonly known as the directional terms such as "above" or "upper". The terms "above" and "below" used to describe the position of the structure refer to the directionality of the position of the structure under common usage.

Example 1

Device Mount

The device mount of example 1 of the present invention can be used to arrange on clothing to become the smart clothing of example 2. Also, the device mount can be combined with the electronic device to provide users with ECG or EMG signal measurement, muscle stimulation, or operational control of other monitoring or measurement during exercise. The electronic device can be a sensing device, a stimulation device, a processing and computing device, or a combination thereof, which is packaged into an integrated device according to the requirements of designers and manufacturers.

In embodiment 1, the electronic device may be a packaged device EMS-IMU (Electrical Muscle Stimulation-Inertial Measurement Unit) which comprises an Electrical Muscle Stimulation (EMS) and an Inertial Measurement Unit (IMU), is able to provide electrical muscle stimulation and sensing body movements. In embodiment 2, the electronic device may be a packaged device EMG-IMU which comprises an electromyography (EMG) and an Inertial Measurement Unit to simultaneously provide myoelectric sensing and body motion sensing. In embodiment 3, the electronic device may be a computing control device. The device mount can be adjusted according to the size of the electronic device, the position and number of electrical contact points, and the connection requirements between the electronic device and other devices. However, the overall design concept is the same, the descriptions of three embodiments are combined as follows. Only when the element is described for the first time, the element symbols of the three embodiments are shown, and subsequently, only the element symbols of the first embodiment are used as representative symbols. The different features are represented by the symbols of the specific embodiments and described separately.

Please refer to the FIGS. 1A-1D of embodiment 1, the FIGS. 3A-3D of embodiment 2, and the FIGS. 4A-4D of embodiment 3. Because the electronic devices 1, 4, and 6 have packaged as a whole with the required functions and components, the lower surfaces 13, 43, 63 of the electronic device are provided with a plurality of metal external contacts 12, 42, 62 for external electrical communication, and a plurality of second positioning structures 11, 41, 61 (and/or 61') are provided on the side edge of the electronic device. The number and location distribution of the metal external contacts 12 depend on the terminals connected to the internal circuit design of the electronic device 1. The device mounts 2, 5, and 7 in embodiment 1 of the present invention are used to electrically connect with the electronic devices 1, 4, and 6, respectively. Device mount 2 can transmit the signal generated by the electronic device 1 or receive the signal and transmit it to the electronic device 1.

The device mount 2, 5, 7 comprises an upper casing 21, 51, 71, a circuit board 22, 52, 72 and a lower casing 23, 53, 73. The device mount 2, 5, 7 further comprises a soft gasket 24, 54, 74. The upper casing 21, 51, 71 comprises a plurality of first through-hole 211, 511, 711, a positioning sidewall 212, 512, 712, a first positioning structure 213, 513, 713, and a concave positioning part 214, 514, 714. The circuit board 22, 52, 72 has a top surface 221, 521, 721 and a bottom surface 222, 522, 722 and comprises a cable interface 2221, 5221, 7221 and metal contacts 223, 523, 723. The lower casing 23, 53, 73 comprises a first convex positioning part 231, 531, 731, a second through-hole 232, 532, 732, and a first cable groove 233, 533, 733. The soft gasket 24, 54, 74 comprises a second convex positioning part 241, 541, 741, an assembly hole 242, 542, 742 and a second cable groove 243, 543, 743. The cable interface 2221, 5221, 7221 is connected with the adapter 31, 31', 31".

A plurality of first through-holes 211 is opened on the surface of the upper casing 21. The number of first through-holes 211 is at least equal to the number of metal external contacts 12 of electronic device 1 so that each position of the metal external contact 12 of electronic device 1 can correspond to the location of one first through-hole 211. The edge of the upper casing 21 is extended upward to form at least one positioning sidewall 212, and at least one first positioning structure 213 is formed around the positioning sidewall 212. The electronic device 1 is placed within the range surrounded by the positioning sidewall 212, and the second positioning structure 11 of the electronic device 1 are engaged with the positioning sidewall 212 through the first positioning structure 213 to fix the electronic device 1 on the surface of the upper casing 21 (the positioning structures 11 and 213 belong to the corresponding fastener structures, so they can be rotated and fixed).

The circuit board 22 is provided with a plurality of metal contacts 223 (such as conductive copper posts), and the top surface 221 of the circuit board 22 is attached below the upper casing 21, so that at least one ring-shaped concave positioning part 214 is formed between the circuit board 22 and the edge wall of the bottom surface of the upper casing 21. The metal contacts 223 of the circuit board 22 penetrates through the first through-hole 211 of the upper casing 21 to form a plurality of metal contact points. The metal contact points are used to contact the metal external contact 12 of the electronic device 1 for electrical connection. On the other hand, a plurality of cable interfaces 2221 protrudes from the bottom surface 222 of the circuit board 22, including but not limited to flexible printed circuit connectors.

At least one first convex positioning part 231 is provided at the periphery of the top surface of the lower casing 23, and the first convex positioning part 231 is combined and positioned inside the concave positioning part 214 of the upper casing 21, so as to wrap the circuit board 22 between the upper casing 21 and the lower casing 23. One or more second through-holes 232 corresponding to the position of the cable interface 2221 are formed on the surface of the lower casing 23 so that the cable interface 2221 of the circuit board 22 can pass through the second through-hole 232. In addition, the bottom surface of the lower casing 23 is concave from the edge to the second through-hole 232 to form a first cable groove 233 so that an adapter 31 at either end of a transmission wire is inserted into the cable interface 2221 in the second through-hole 232 along the first cable groove 233. Furthermore, referring to FIG. 3A, the lower casing 53 may further include a foolproof structure 534 so that the upper casing and the lower casing can be properly combined.

A soft gasket 24 can be further extended to surround the periphery of upper casing 21 or lower casing 23 so that an assembly hole 242 is formed in the center of the soft gasket 24 to expose the bottom surface of the lower casing 23 and the cable interface 2221 in the second through-hole 232, wherein the soft gasket 24 can be used as combining elements of device mount 2 and smart clothing, for example, adhering the soft gasket 24 to the smart clothing. The bottom surface of soft gasket 24 is concaved toward the first cable groove 233 to form a second cable groove 243, the inclination of the second cable groove 243 is the same as the inclination of the first cable groove 233 so that the second cable groove 243 and the first cable groove 233 extend out a continuously extending plane. Therefore, adapter 31 can be inserted into the cable interface 2221 in the second through-hole 232 along the first cable groove 233 and the second cable groove 243 smoothly, and the adapter 31 is set in the first cable groove 233 without protruding to affect the subsequent process of smart clothing, and the transmission wire is less likely to be damaged.

Figure 2:
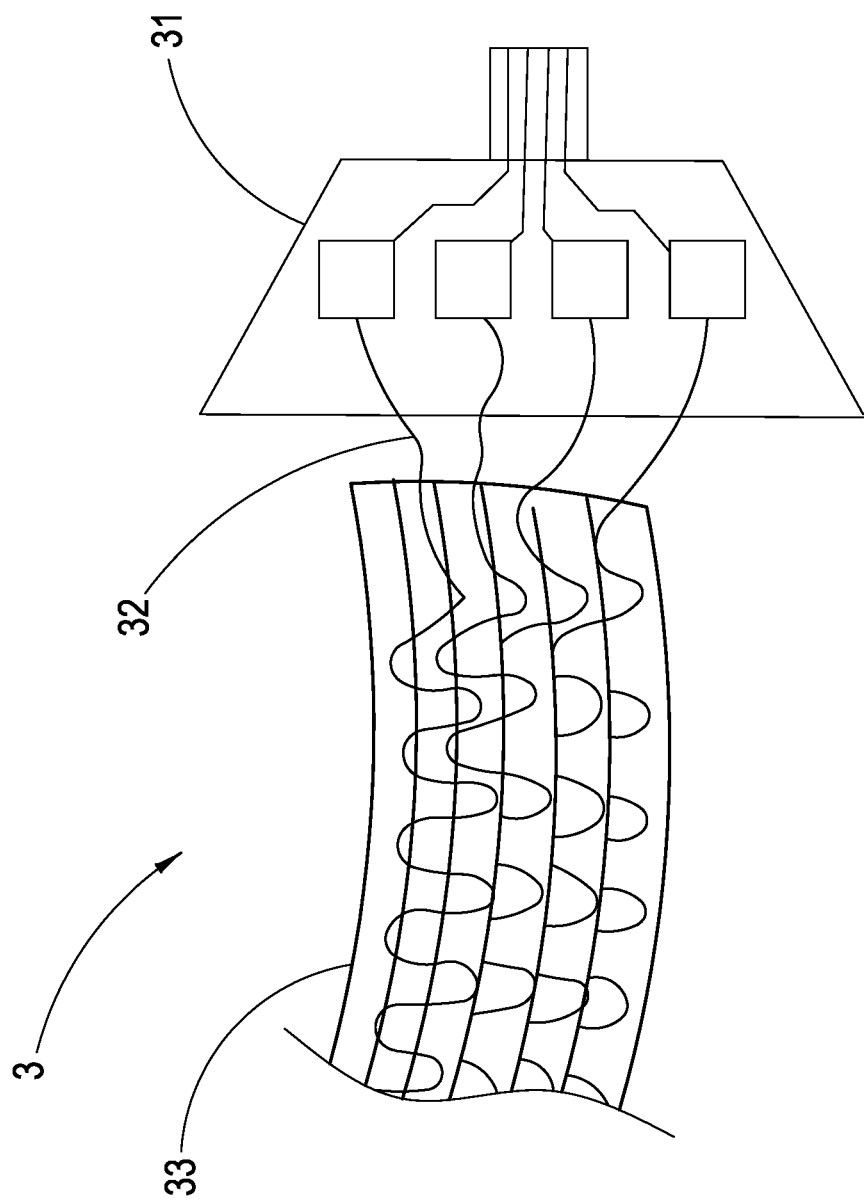
FIG. 2 is the schematic view of the transmission wire in the device mount of the present invention.
Figure 3A:
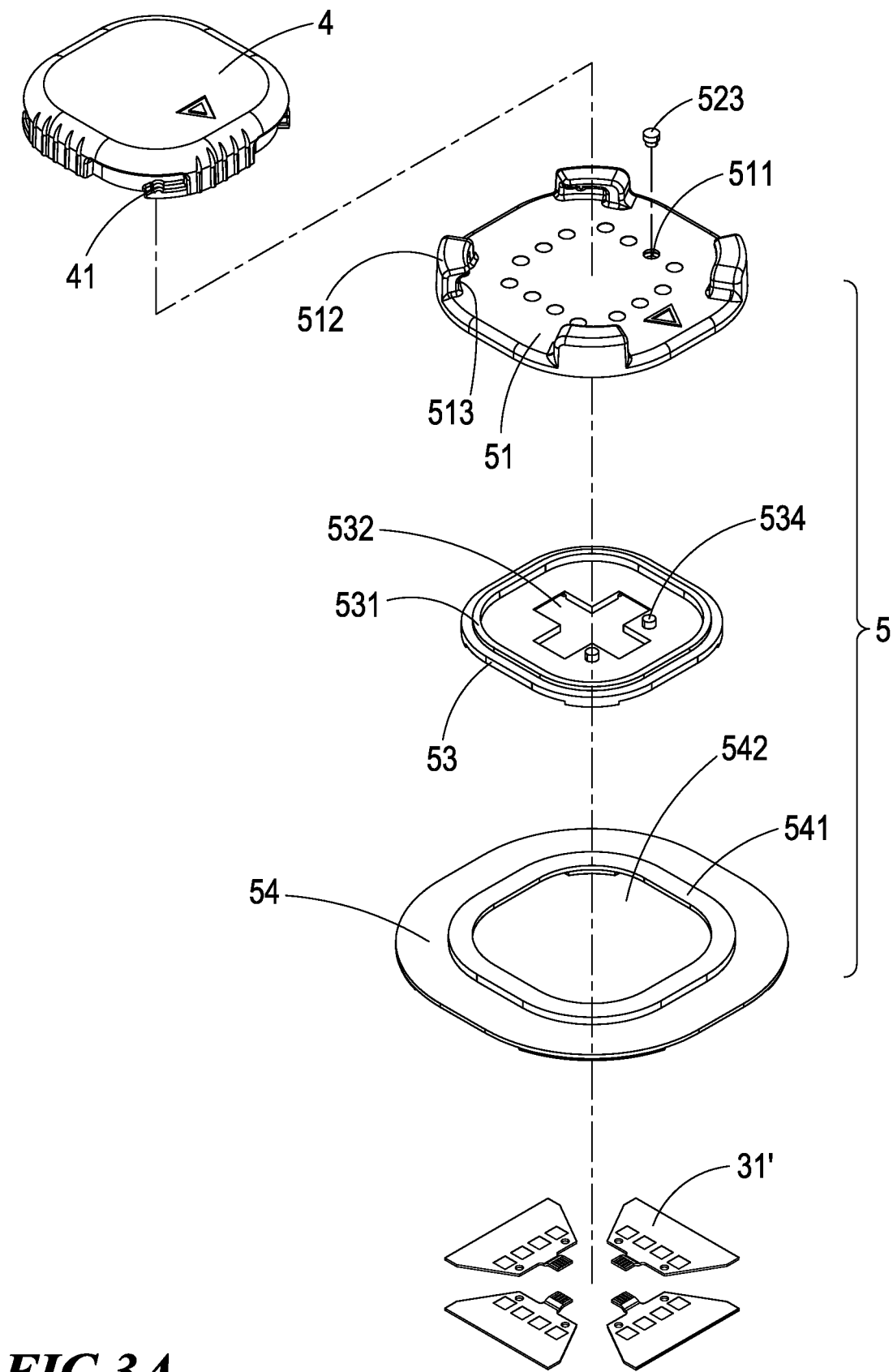
FIG. 3A is the oblique top view of the exploded structure of the device mount in embodiment 2 of the present invention.
Figure 3B:
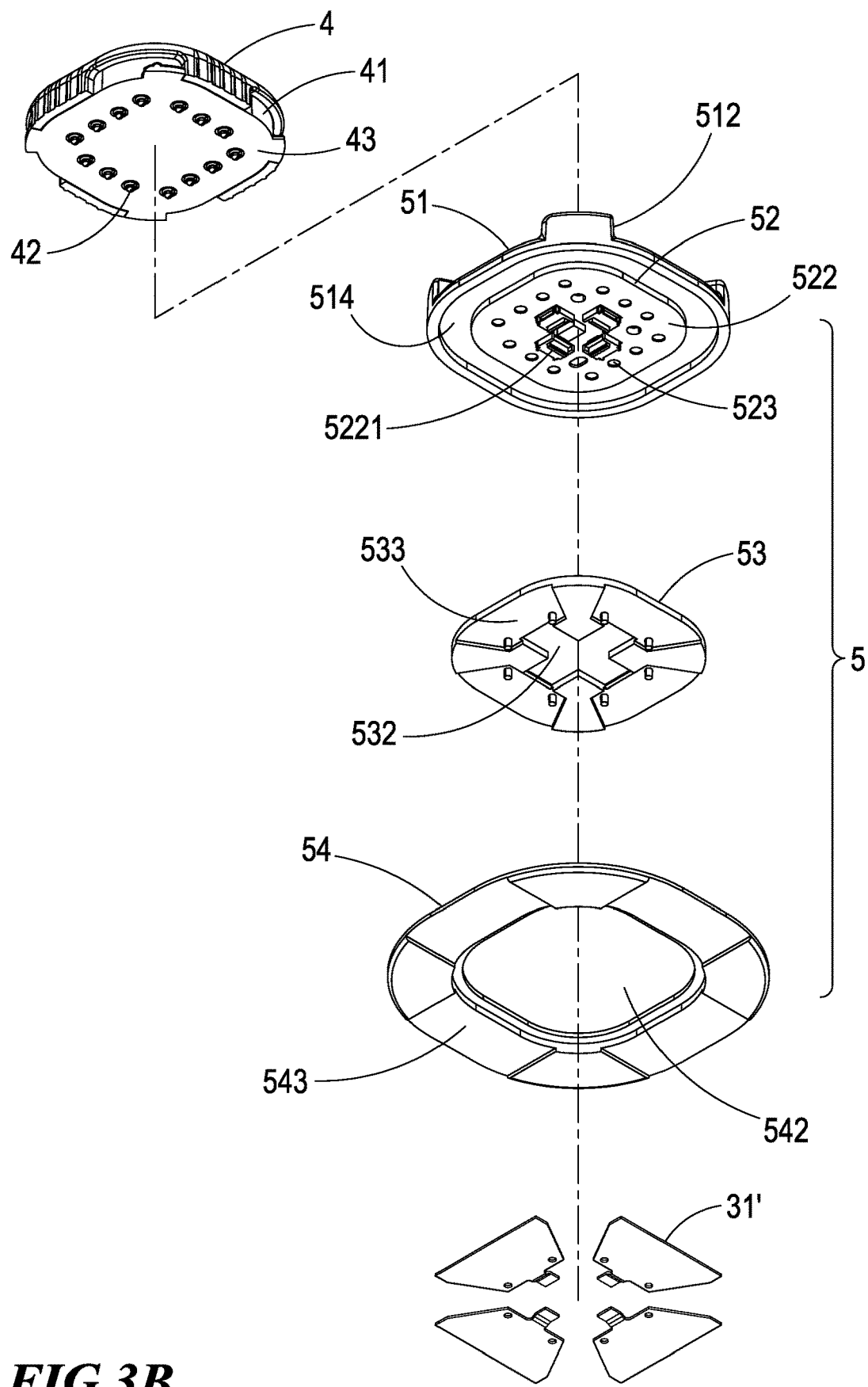
FIG. 3B is the oblique bottom view of the exploded structure of the device mount in embodiment 2 of the present invention.
Figure 4A:
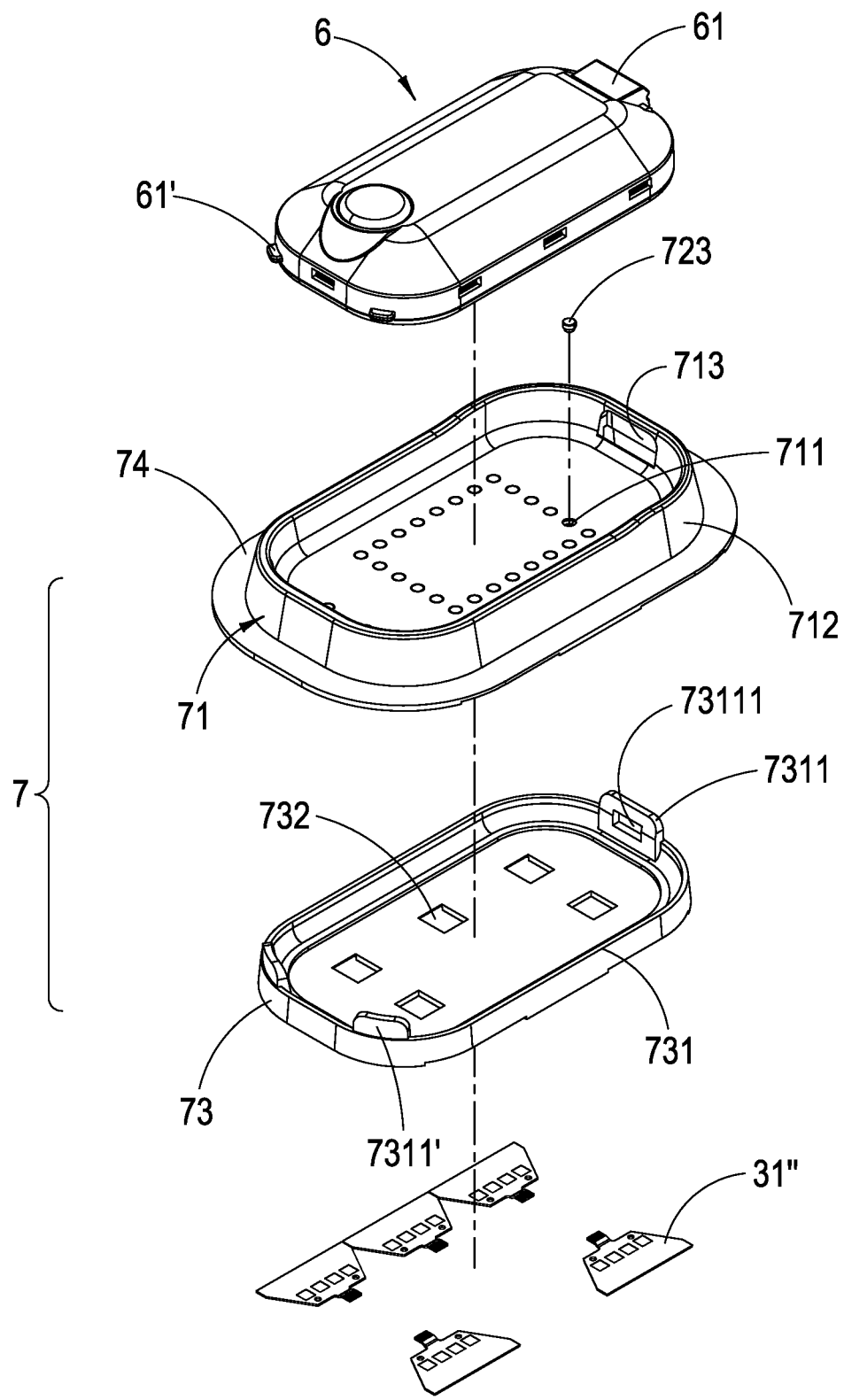
FIG. 4A is the oblique top view of the exploded structure of the device mount in embodiment 3 of the present invention.
Figure 4B:
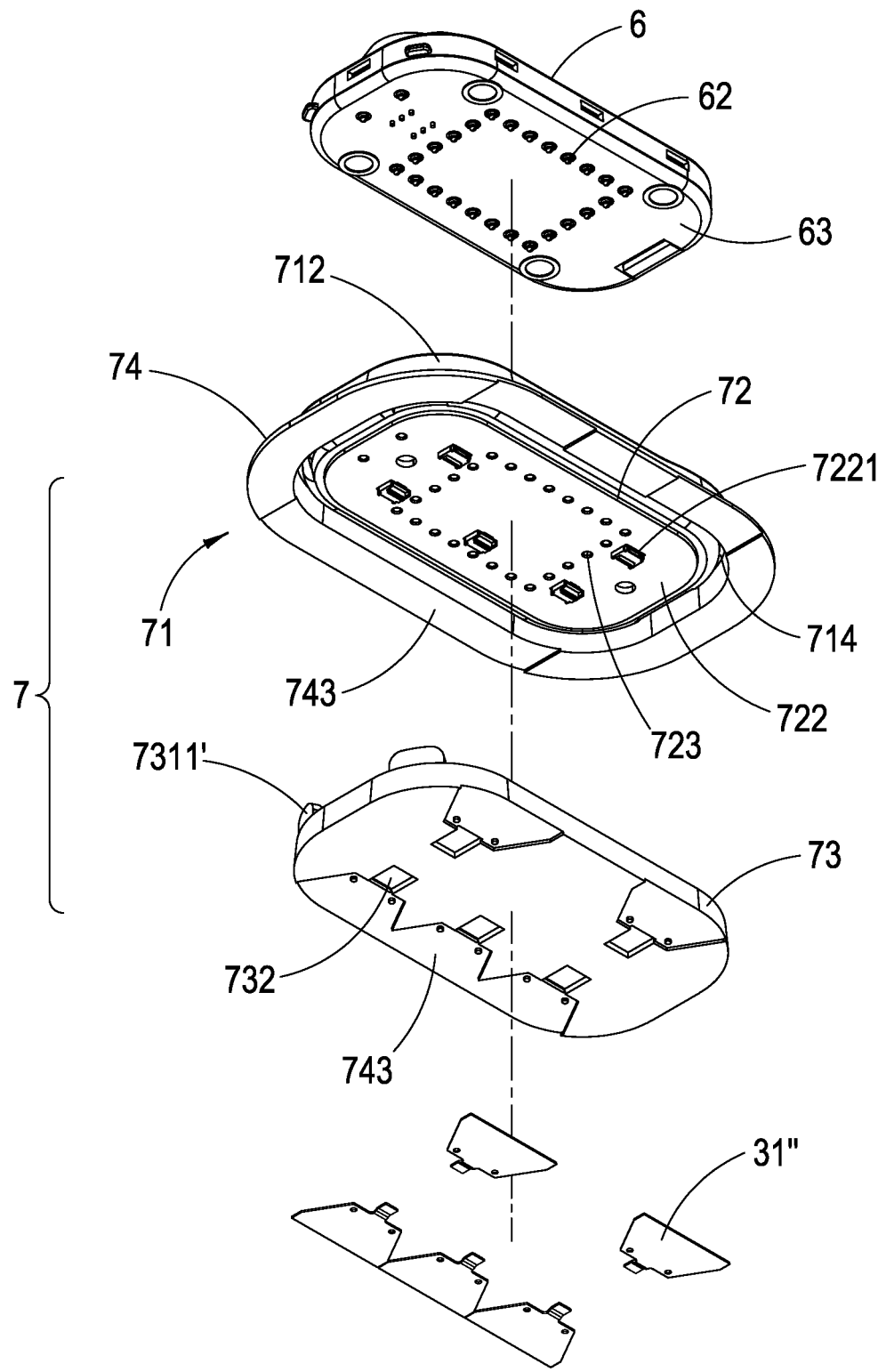
FIG. 4B is the oblique bottom view of the exploded structure of the device mount in embodiment 3 of the present invention.
Figure 4C:
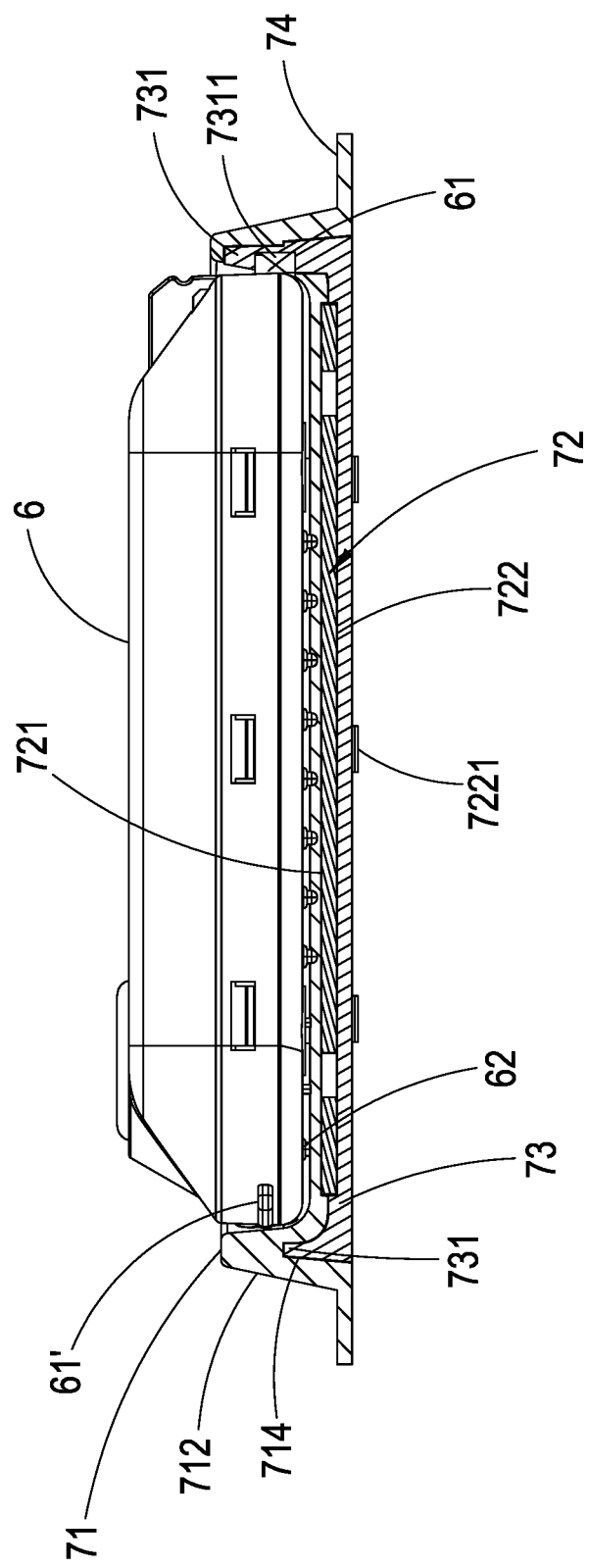
FIG. 4C is the schematic diagram of the combined cross-section structure of the device mount in embodiment 3 of the present invention.
Figure 4D:
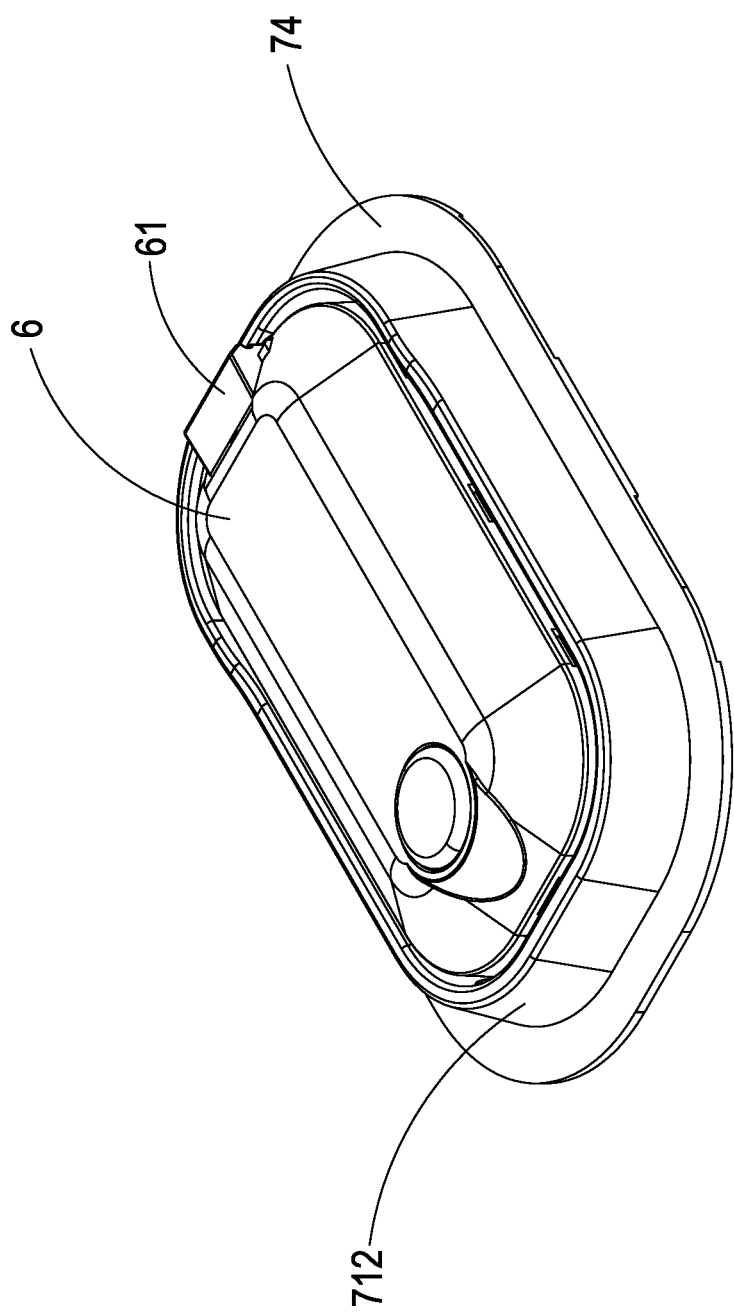
FIG. 4D is the schematic diagram of the combined three-dimensional structure of the device mount in embodiment 3 of the present invention.

As shown in FIG. 2, transmission wire 3 is a plurality of metal wires 32 arranged in a wavy or zigzag shape inside a telescopic elastic belt 33, and the metal wires 32 are connected to the adapter 31. In the embodiment of the present invention, Flexible Printed Circuit Board (FPCB) is used as the adapter 31 to connect and plug into cable interface 2221, so as to transmit the sensing signal or control signal generated by the electronic device 1 through transmission wire 3 to the cable interface 2221 of another device mount 2, the cable interface 2221 of a battery device, or the cable interface 2221 of an electrode patch which is connected with the other adapter 31 at the other end of transmission wire 3.

The setting and design of the positioning sidewall and the positioning structure can be adjusted according to the shape, size, weight, or wiring considerations of the electronic device. Therefore, the positioning structure corresponding to the lower casing and soft gasket may also be further adjusted slightly. In addition, the number and direction of the cable interface will also be adjusted according to the connection between the electronic device and the smart clothing. Thus, the position and direction of the first cable groove of the lower casing and the second cable groove of the soft gasket may also be adjusted accordingly, but the main concepts of the device mount would not be affected.

For example, in FIG. 1A~1D of embodiment 1/FIG. 3A~3D of embodiment 2, the upper casing 21/51 is provided with four positioning sidewalls 212/512 and the four first positioning structures 213/513 are used to fasten to the four second positioning structures 11/41 of the electronic device 1/4, so as to make the electronic device 1/4 fix within the range delineated by the four positioning sidewalls 212/512. In order to facilitate the connection between the electronic device 1/4 and other electronic devices, a set of cable interfaces 2221/5221, first cable groove 233/533, and second cable groove 243/543 can be arranged in each of the four vertical directions. There is at least one annular second convex positioning part 241/541 at the periphery of the top surface of the soft gasket 24/54, and the first convex positioning part 231/531 and the second convex positioning part 241/541 can be inserted together and positioned in the concave positioning part 214/514 of the upper casing 21/51. In addition, the lower casing 23/53 is tightly fitted in the assembly hole 242/542 so that the lower casing 23/53 is combined with the upper casing 21/51, and the soft gasket 24/54 is further extended towards the periphery of the lower casing 23/53.

For example, FIG. 4A~4D of embodiment 3, the edge of the upper casing 71 is extended upward into a surrounding positioning sidewall 712 to form a bottom slot, and at least one first positioning structure 713 is formed around the positioning sidewall 712. The first positioning structure 713 can be an opening hole or a groove, which is used to correspond to the movable positioning structure 61 or the fixed positioning structure 61' of the electronic device 6, wherein the movable positioning structure 61 can be a clasp structure. At least one annular first convex positioning part 731 is disposed on the periphery of the top surface of the lower casing 73, and the first convex positioning part 731 can be further provided with a third positioning structure 7311 protruded from the first convex positioning part 731 (such as a hole-shaped third positioning structure 7311 or a groove-shaped third positioning structure 7311'). Therefore, when the lower casing 73 is combined with the upper casing 71, the first convex positioning part 731 will be inserted into the concave positioning part 714, and the third positioning structure 7311 will be exposed in the opening hole-shaped first positioning structure 713. Thus, the electronic device 6 can be placed within the enclosed range of the positioning sidewall 712, and then the movable positioning structure 61 of the electronic device 6 can be inserted into the opening hole 73111 of the third positioning structure 7311 exposed in the concave positioning part 714. Further, the fixed positioning structure 61' can be inserted into the groove-shaped third positioning structure 7311' so that the electronic device 6 can be firmly placed in the bottom slot. The soft gasket 74 is formed by extending outward of the positioning sidewall 712 of the upper casing 71. In order to facilitate the connection between the electronic device 6 and other electronic devices, a plurality of sets of cable interfaces 7221 and a plurality of corresponding first cable grooves 733 and second cable grooves 743 can be provided on both sides of the circuit board 72 in opposite directions.

Example 2

Smart Clothing

Figure 5A:
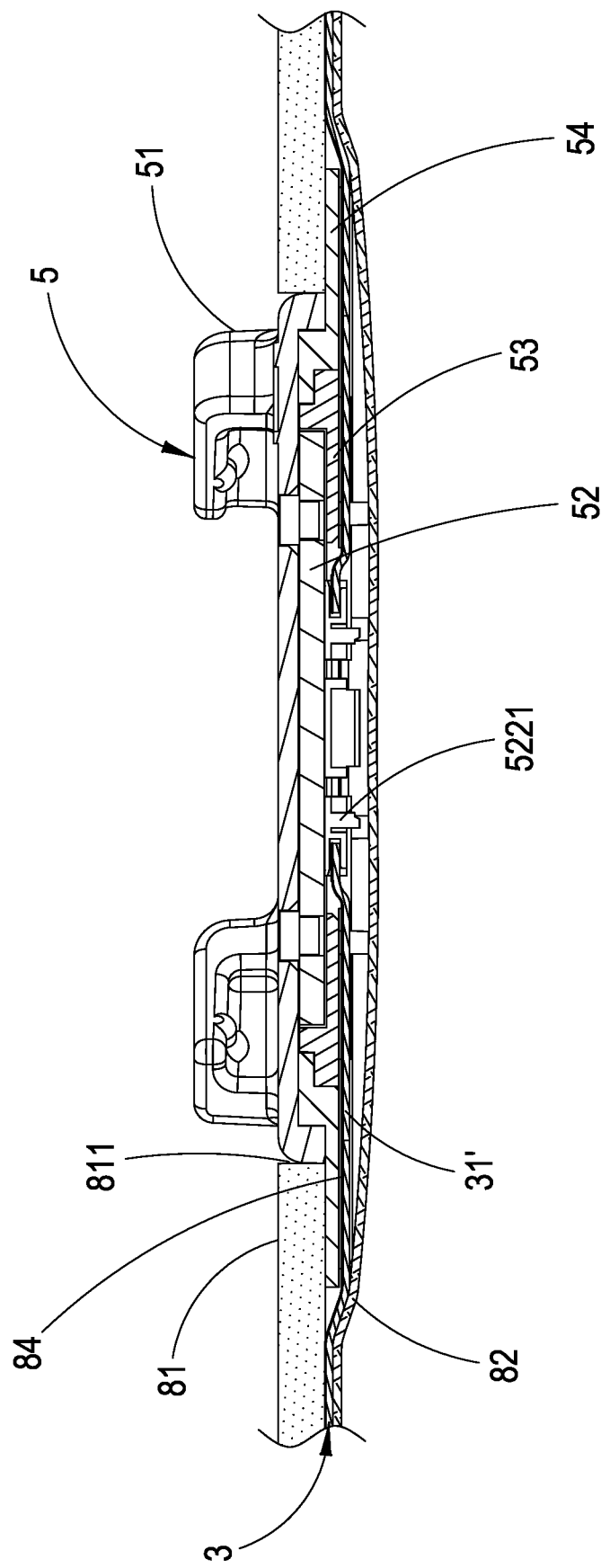
FIG. 5A is the schematic diagram of the combined cross-section structure of the device mount and clothing body of the present invention.
Figure 5B:
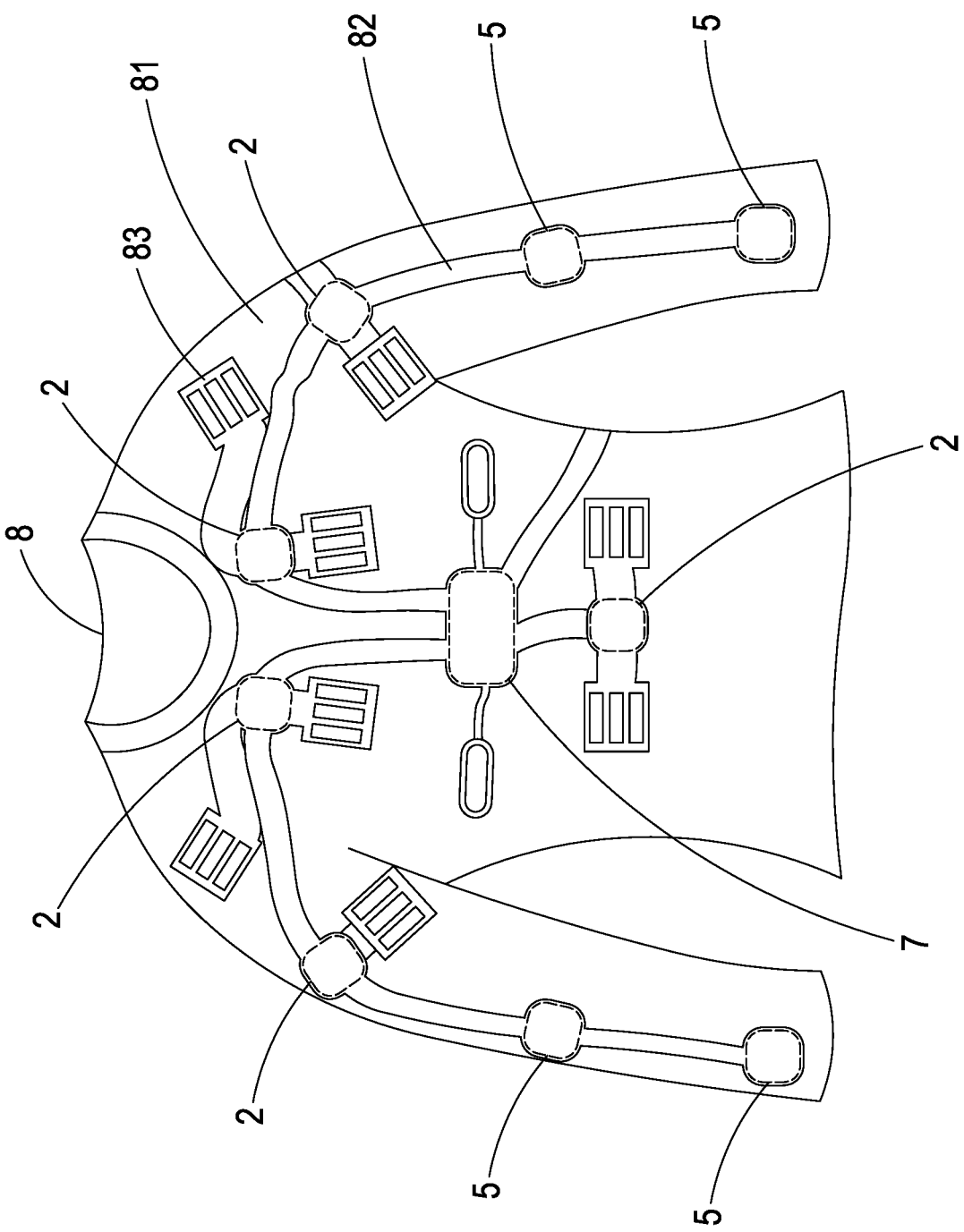
FIG. 5B is the schematic diagram of the inner side of the smart clothing of the present invention.

As shown in FIGS. 5A and 5B, the example 2 of the present invention provides a smart clothing using the device mount of example 1. The smart clothing includes the device mount described in example 1, the clothing body, and at least one transmission wire described in example 1, wherein the cloth body includes a surface fabric layer 81 and a waterproof protective layer 82. When device mount 5 is combined with a cloth body 8, an opening hole 811 on the surface fabric layer 81 needs to be dug out first, and then pass the device mount 5 through the opening hole 811. Then, the soft gasket 54 of the device mount 5 will be attached (by hot pressing method) on the inner surface of the surface fabric layer 81, and the upper casing 51 is exposed outside the surface fabric layer 81, and the cable interface 5221 of the circuit board 52 faces the inner side of the surface fabric layer 81.

The adapter 31' at either end of the transmission wire 3 is inserted into the cable interface in the second through-hole along the second cable groove and the first cable groove, the other end of the transmission wire 3 extends and lays out in the inner side of the surface fabric layer 81 to any directions according to transmission requirements. In order to protect the circuit components of the circuit board 52 and the transmission wire 3, a waterproof protective layer 82 is bonded to the inner surface of the surface fabric layer 81 (by sewing or hot-pressing bonding) to cover upward the bottom surface of the lower casing 53 and the extension range of the transmission wire 3. In order to increase the waterproofness, a waterproof surface layer can be further laid on the inner surface of the surface fabric layer 81, and the waterproof surface layer 84 can be pasted corresponding to the waterproof protective layer 82 to completely wrap the transmission wire 3; or a waterproof surface layer 84 can be further laid on the upper surface of the transmission wire 3, and the waterproof protective layer 82 is fixedly attached to the inner surface of the surface fabric layer 81 by bonding or sewing.

As shown in FIG. 5B, device mounts 2, 5, 7 of different types of electronic devices, the wiring of the transmission wire 3, at least one battery device with cable interface or/and at least one electrode patch 83 with cable interface are arranged on the clothing body 8. It can be observed inside the clothing body 8 that the transmission wire extends from the inner surface of the surface fabric layer to the cable interface of another device mount, the cable interface of the battery device, or the cable interface of the electrode patch. The electronic device mount can be the device mount 2 of the EMS-IMU combination device, the device mount 5 of the EMG-IMU combination device and/or the device mount 7 of the computing control device, or the device mount of the electronic device with a battery. The user can configure it according to their needs. The clothing body 8 can be cleaned directly, and it is more economical as a consumable.

Figure 5C:
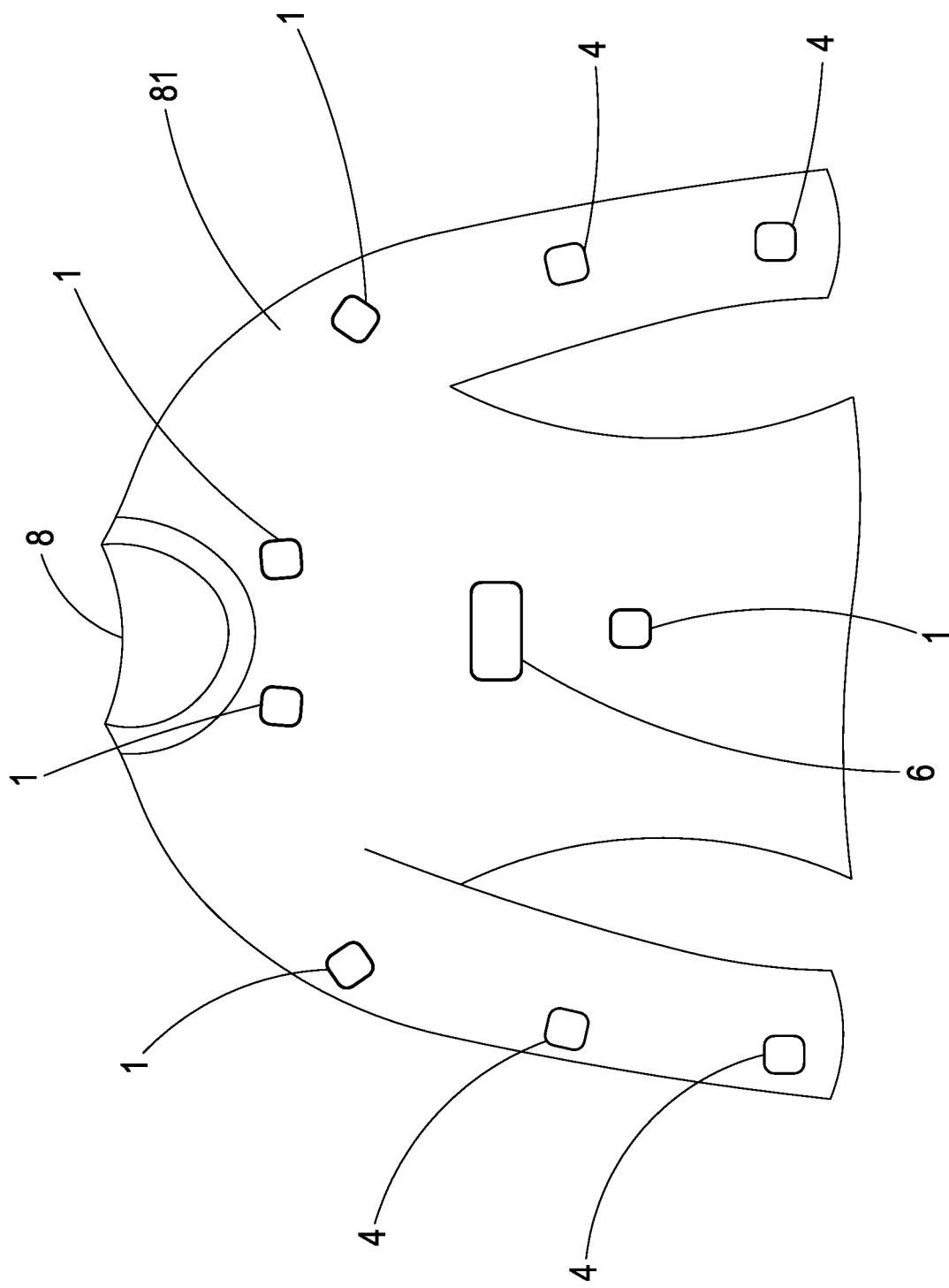
FIG. 5C is the schematic diagram of the outer side of the smart clothing of the present invention when the electronic device is installed.

As shown in FIG. 5C, when the user needs to exercise, the electronic devices 1, 4, and 6 can be mounted on the device mounts 2, 5, and 7. Also, the electronic devices 1 and 4 are used for sensing, and the sensing signals are transmitted to the device mount 7 through device mounts 2, 5, and the sensing signals are received, operated and controlled by the electronic device 6 connected to the device mount 7. For example, controlling the electronic device 1 to supply power to the electrode patch 83 so as to perform muscle stimulation through the electrode patch 83. Therefore, according to the set electronic device, the smart clothing of the present invention can not only receive ECG signals, EMG signals, and limb inertial signals to understand the exercise conditions but also can stimulate the muscles according to the movement conditions to improve the training results.

Although the present invention has been described in terms of specific exemplary embodiments and examples, it will be appreciated that the embodiments disclosed herein are for illustrative purposes only and various modifications and alterations might be made by those skilled in the art without departing from the spirit and scope of the invention as set forth in the following claims.

What is claimed is:

1. A device mount, which is used for electrical connection with an electronic device with a plurality of metal external contacts on a lower surface, wherein the device mount includes:
    an upper casing provided with a plurality of first through-holes on the surface, and the edge of the upper casing extending upward to form at least one positioning sidewall, and at least one first positioning structure being formed around the positioning sidewall, and the electronic device being fixed in the range surrounded by the positioning sidewall through the first positioning structure, and the position of the first through-hole corresponding to the position of the metal external contact of the electronic device, and a concave positioning part is provided at the periphery of the bottom surface of the upper casing;
    a circuit board provided with a plurality of metal contacts, the top surface of the circuit board being attached under the upper casing, and the metal contacts penetrating the first through-holes to form a plurality of metal contact points, and the metal contact points being used for contacting with the metal external contacts, and the bottom surface of the circuit board being provided with a plurality of cable interfaces; and
    a lower casing, at least one first convex positioning part being arranged at the periphery of a top surface of the lower casing, and the first convex positioning part being positioned in the concave positioning part so that the lower casing and the upper casing are connected, and the circuit board being wrapped between the upper casing and the lower casing, and a plurality of second through-holes being opened on the surface of the lower casing corresponding to the position of the cable interface, which is made for the cable interface of the circuit board to pass through the second through-hole, and a bottom surface of the lower casing being concaved from the edge to the second through-hole to form a first cable groove which is used to inserting an adapter at either end of a transmission wire into the cable interface in the second through-hole along the first cable groove.

2. The device mount according to claim 1, wherein a soft gasket extends outward from the periphery of the upper casing or the lower casing, and a bottom surface of the soft gasket is concaved toward the first cable groove to form a second cable groove, and the inclination of the second cable groove is the same as the inclination of the first cable groove so that the second cable groove and the first cable groove extend out a continuously extending plane.

3. The device mount according to claim 1, wherein the electronic device is a sensing device, a stimulation device, a processing device or a combination thereof.

4. The device mount according to claim 1, wherein the transmission wire is a telescopic elastic belt body, and a plurality of metal wires are arranged in a wave or zigzag shape inside the telescopic elastic belt body, wherein the metal wires are connected to the adapter.

5. The device mount according to claim 1, wherein the adapter at one end of the transmission wire is connected to the cable interface, and the adapter at the other end of the transmission wire is connected to a cable interface of another device mount, a cable interface of a battery device, or a cable interface of an electrode patch.

6. The device mount according to claim 2, wherein the soft gasket includes a second convex positioning part and an assembly hole is formed, the second convex positioning part and the first convex positioning part are combined in the concave positioning part, and the lower casing is tightly sealed in the assembly hole so that the periphery of the lower casing extends outwardly of the soft gasket.

7. The device mount according to claim 2, wherein the soft gasket is arranged and extended around the periphery of the upper casing.

8. The device mount according to claim 2, wherein the lower casing further includes a foolproof structure for combining the upper casing and the lower casing properly.

9. The device mount according to claim 2, wherein the transmission wire is a flexible printed circuit board.

10. A smart clothing using a device mount, comprising:
    at least one device mount of claim 2;
    a clothing body having a surface fabric layer, at least one opening hole being dug on the surface fabric layer, and the device mount passing through the opening hole, and the soft gasket being attached to an inner side of the surface fabric layer so that the upper casing is exposed to an outer side of the surface fabric layer, and the cable interface of the circuit board facing the inner side of the surface fabric layer; and at least one transmission wire, an adapter at either end of the transmission wire being inserted into the cable interface in the second through-hole along the second cable groove and the first cable groove, and the transmission wire extending along the inner surface of the surface fabric layer in any direction, and the inner surface of the surface fabric layer being combined with a waterproof protective layer to cover the bottom surface of the lower casing and the extension range of the transmission wire.

11. The smart clothing using a device mount of claim 10, further comprises an electronic device, the electronic device is a sensing device, a stimulation device, a processing device, or a combination thereof.

12. The smart clothing using a device mount of claim 11, further comprising at least one battery device with a cable interface or/and at least one electrode patch with a cable interface, and the transmission wire being extended from the inner surface of the surface fabric layer and connected to the cable interface of another device mount, the cable interface of the battery device or the cable interface of the electrode patch.

13. The smart clothing using a device mount of claim 12, wherein the adapter at one end of the transmission wire is connected to the cable interface, and the adapter at the other end of the transmission wire is connected to a cable interface of another device mount, the cable interface of the battery device, or the cable interface of the electrode patch.

14. The smart clothing using a device mount of claim 10, wherein the soft gasket includes a second convex positioning part and an assembly hole is formed, the second convex positioning part and the first convex positioning part are combined in the concave positioning part, and the lower casing is tightly sealed in the assembly hole so that the periphery of the lower casing extends outwardly of the soft gasket.

15. The smart clothing using a device mount of claim 10, wherein the soft gasket is arranged and extended around the periphery of the upper casing.

16. The smart clothing using a device mount of claim 10, wherein a waterproof surface layer is further laid on an upper surface of the transmission wire, and the waterproof protective layer is attached to the inner surface of the surface fabric layer by bonding or sewing.

17. The smart clothing using a device mount of claim 10, wherein a waterproof surface layer is further laid on the inner surface of the surface fabric layer, and the waterproof surface layer is pasted on the waterproof protective layer to wrap the transmission wire.

18. The smart clothing using a device mount of claim 10, wherein the transmission wire is a telescopic elastic belt body, and a plurality of metal wires arranged in wave or zigzag shape inside the telescopic elastic belt body, wherein the metal wires are connected to the adapter.

19. The smart clothing using a device mount of claim 10, wherein the lower casing further includes a foolproof structure for combining the upper casing and the lower casing properly.

20. The smart clothing using a device mount of claim 10, wherein the transmission wire is a flexible printed circuit board.

\* \* \* \* \*